(12) United States Patent
Fratti

(10) Patent No.: US 6,597,243 B1
(45) Date of Patent: Jul. 22, 2003

(54) DISTRIBUTED AMPLIFIER HAVING A TAPERED TRANSCONDUCTANCE ARCHITECTURE

(75) Inventor: Roger A. Fratti, Mohnton, PA (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 10/039,682

(22) Filed: Dec. 31, 2001

(51) Int. Cl.[7] .................................................. H03F 3/60
(52) U.S. Cl. ...................... 330/54; 330/124 R; 330/286; 330/295
(58) Field of Search .............................. 330/54, 124 R, 330/286, 295

(56) References Cited

U.S. PATENT DOCUMENTS

| | | | | |
|---|---|---|---|---|
| 5,046,155 A | * | 9/1991 | Beyer et al. | 330/54 |
| 5,055,795 A | * | 10/1991 | Kasper et al. | 330/54 |
| 5,208,547 A | * | 5/1993 | Schindler | 330/54 |
| 5,274,339 A | * | 12/1993 | Wideman et al. | 330/54 |
| 5,361,038 A | * | 11/1994 | Allen et al. | 330/54 |
| 5,365,197 A | * | 11/1994 | Ikalainen | 330/286 |
| 5,367,267 A | * | 11/1994 | Fuchs | 330/54 |
| 5,751,190 A | * | 5/1998 | Nguyen et al. | 330/54 |
| 5,920,230 A | * | 7/1999 | Beall | 330/54 |
| 6,049,250 A | * | 4/2000 | Kintis et al. | 330/54 |
| 6,094,099 A | * | 7/2000 | Kobayashi | 330/254 |

OTHER PUBLICATIONS

Alan B. Grebene, "Bipolar and MOS Analog Integrated Circuit Design ," John Wiley & Sons, pp. 215–246, 1984.
Paul R. Gray et al., "Analysis and Design of Analog Integrated Circuits," Second Edition, John Wiley & Sons, pp. 233–246, 1984.
Y. Betser et al., "Emerging Technologies Series #3: Readying Receivers for 40–Gbps Operation," Communication Systems Design, pp. 39–40 and 42–43, Aug. 2001.

* cited by examiner

*Primary Examiner*—Michael Tokar
*Assistant Examiner*—Khai Nguyen
(74) *Attorney, Agent, or Firm*—Ryan, Mason & Lewis, LLP

(57) ABSTRACT

A distributed amplifier having an improved transimpedance and/or gain comprises an input transmission line, the input transmission line forming an input of the distributed amplifier and having a characteristic impedance associated therewith, and an output transmission line, the output transmission line forming an output of the distributed amplifier and having a characteristic impedance associated therewith. The distributed amplifier further comprises a plurality of amplifying stages, each of at least a subset of the amplifying stages including an input and an output, the input of each amplifying stage in the subset being operatively coupled to the input transmission line and the output of each amplifying stage in the subset being operatively coupled to the output transmission line. Each amplifying stage in the subset has a transconductance associated therewith which is operatively configured so as to produce a gain in the respective amplifying stage that substantially compensates for an input signal attenuation at the respective input of the amplifying stage. The present invention provides techniques for efficiently improving an output transimpedance and/or increasing an overall gain in a distributed amplifier without proportionally increasing the quiescent current and/or noticeably degrading the frequency response in the distributed amplifier. Moreover, such performance enhancements are achieved without a significant increase in the size of the distributed amplifier.

24 Claims, 2 Drawing Sheets

DISTRIBUTED AMPLIFIER HAVING A TAPERED TRANSCONDUCTANCE ARCHITECTURE

FIELD OF THE INVENTION

The present invention relates generally to distributed amplifiers, and more particularly relates to techniques for increasing an overall gain in a distributed amplifier without proportionally increasing a quiescent current in the distributed amplifier.

BACKGROUND OF THE INVENTION

Distributed amplifiers are well-known in the art. Such distributed amplifiers generally include a plurality of basic amplifying stages that are connected between input and output transmission lines such that the outputs of the basic amplifying stages are combined to produce a resultant amplified signal.

Each of the basic amplifying stages in a distributed amplifier contain reactances, mostly capacitive, which affect the input and output impedances of those stages. A properly designed distributed amplifier compensates for these reactances so as to minimize the effect upon the transfer of power in a desired frequency range of operation. Conventionally, this has been accomplished by including compensation networks coupled to the input and output transmission lines. These compensation networks typically include both inductances and capacitances along their lengths so as to appear as short lengths of transmission lines having specific characteristic impedances.

The input capacitance of each amplifying stage when separated by an inductance, whether lumped or distributed, determines the characteristic impedance of the overall transmission line. One problem with conventional distributed amplifier architectures is that as a signal propagates down the input transmission line it is attenuated, and the power input to each successive amplifying stage therefore becomes significantly reduced. This problem exists on the output transmission line as well, although it is generally less significant because the signals are amplified by the transconductance of each amplifying stage. For a given number of amplifying stages, the decay in input power degrades the total output power and gain available from the distributed amplifier.

Conventional techniques for reducing the input power decay include coupling additional amplifying stages to the distributed amplifier. However, because of the decaying input signal, there is a point of diminishing returns to this approach. Moreover, the use of additional amplifying stages increases both the size and current consumption of the distributed amplifier. Another conventional approach for increasing the overall gain of the distributed amplifier is to uniformly increase the transconductance of each of the amplifying stages to account for worst case loss on the transmission line. However, since uniformly increasing the transconductance of the amplifying stages generally involves increasing the size of one or more transistors in each of the amplifying stages of the distributed amplifier, this approach can significantly degrade the frequency response and undesirably increase the quiescent current in the distributed amplifier.

SUMMARY OF THE INVENTION

The present invention provides techniques for efficiently improving an output transimpedance and/or increasing an overall gain in a distributed amplifier without proportionally increasing the quiescent current and/or noticeably degrading the frequency response in the distributed amplifier. Moreover, such performance enhancements are achieved without a significant increase in the size of the distributed amplifier.

In accordance with one aspect of the invention, a distributed amplifier having an improved output transimpedance includes a plurality of amplifying stages operatively coupled between an input transmission line and an output transmission line. Each of at least a subset of the amplifying stages has a transconductance associated therewith which is operatively configured so as to produce a gain in the amplifying stage which substantially compensates for an input signal attenuation on the input transmission line and/or output transmission line. Thus, the transconductance of each successive amplifying stage in the subset is increased in accordance with the input line loss at the input of the respective amplifying stage. In this manner, each amplifying stage in the subset is individually configured to compensate for an input transmission line loss. In a preferred embodiment of the present invention, every amplifying stage in the distributed amplifier is configured so as to have a transconductance which substantially compensates for an input signal attenuation at a respective input and/or output on the input transmission line and/or output transmission line.

In accordance with another aspect of the present invention, a method is provided for forming a distributed amplifier including a plurality of amplifying stages. Each of the amplifying stages has a transconductance associated therewith and includes an input and an output, the inputs of the plurality of amplifying stages being operatively coupled to an input transmission line and the outputs of the amplifying stages being operatively coupled to an output transmission line. The method comprises the steps of: determining an input signal attenuation at the respective inputs of at least a subset of the plurality of amplifying stages; and selecting the transconductances of each of the amplifying stages in the subset such that a gain of each of the plurality of amplifying stages in the subset substantially compensates for an input signal attenuation on the input transmission line at the respective inputs of the amplifying stages.

These and other features and advantages of the present invention will become apparent from the following detailed description of illustrative embodiments thereof, which is to be read in connection with the accompanying drawings.

DETAILED DESCRIPTION OF THE PREFERRED EMBODIMENTS

The present invention will be described herein in the context of an illustrative four-stage distributed amplifier circuit which may be used, for example, in an optical receiver front-end application. It should be appreciated, however, that the present invention is not limited to this or any particular distributed amplifier architecture or application. Rather, the invention is more generally applicable to any suitable distributed amplifier architecture in which it is desirable to improve a transimpedance and/or gain of the distributed amplifier without proportionally increasing a quiescent current in the distributed amplifier. Moreover, the present invention as described herein is not limited to a particular semiconductor fabrication process, but may be used with processes including, but not limited to, metal-oxide-semiconductor (MOS), bipolar, and metal-semiconductor field-effect-transistor (MESFET) technologies. The term "amplifier" as used herein essentially refers to a circuit for multiplying an input signal applied to the circuit by a predetermined gain which is greater than or equal to one.

Figure 1:
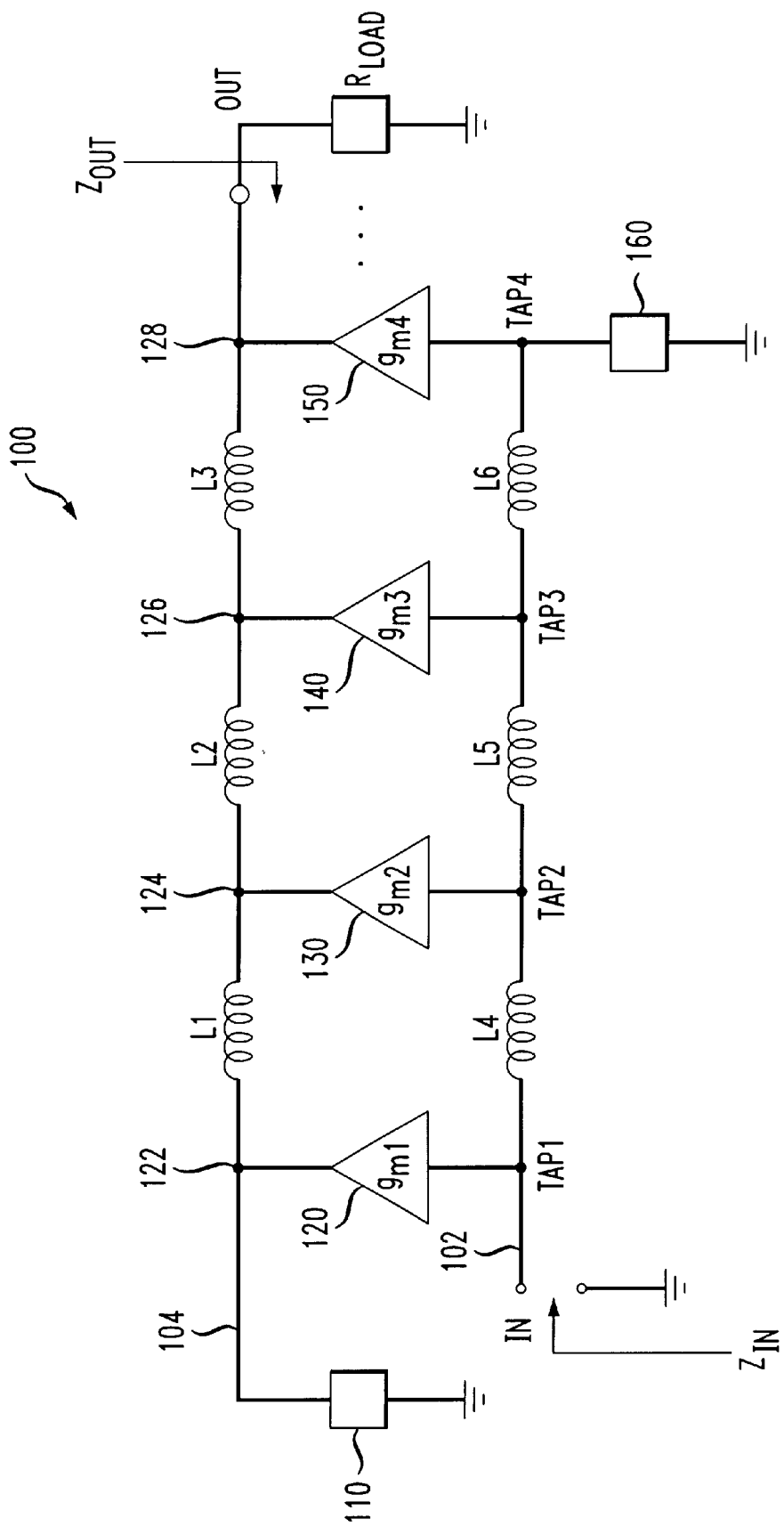
FIG. 1 is schematic diagram illustrating an exemplary distributed amplifier, formed in accordance with the present invention.

FIG. 1 is a schematic diagram illustrating an exemplary distributed amplifier 100, formed in accordance with one aspect of the present invention. The distributed amplifier 100 includes a plurality of amplifying stages 120, 130, 140 and 150, each of the amplifying stages including an input and an output. It is to be appreciated that although the illustrative distributed amplifier 100 is shown having four amplifying stages, the present invention contemplates that any number of amplifying stages may be employed in accordance with the techniques described herein.

In the distributed amplifier 100, an input signal is received through an input IN of the distributed amplifier. The distributed amplifier 100 has an input impedance $Z_{IN}$ as measured at the input IN which enables the distributed amplifier to be coupled to an external input transmission line (not shown) having a characteristic impedance which is substantially equal to impedance $Z_{IN}$ or to a preceding circuit or stage (not shown) having an output impedance substantially equal to impedance $Z_{IN}$. The input impedance may be on the order of fifty ohms, for example, to allow the distributed amplifier 100 to be coupled to a standard fifty-ohm transmission line, although it is to be appreciated that the input impedance $Z_{IN}$ may be of any desired value, as required by the transmission line or circuit to be coupled to the distributed amplifier 100.

Likewise, in the distributed amplifier 100, an output signal is generated at an output OUT of the distributed amplifier 100. The distributed amplifier 100 has an output impedance $Z_{OUT}$ associated therewith as measured at the output OUT which enables the distributed amplifier to be coupled to an external output transmission line (not shown) having a characteristic impedance which is substantially equal to impedance $Z_{OUT}$ or to a subsequent circuit or stage (not shown) having an input impedance substantially equal to impedance $Z_{OUT}$. For example, the output impedance may be about fifty ohms to allow the distributed amplifier 100 to be coupled to a standard fifty-ohm transmission line, although it is to be appreciated that the output impedance $Z_{OUT}$ may be configured to be of any value as required by the transmission line or circuit to be coupled to the distributed amplifier 100.

The amplifying stages 120, 130, 140, 150 of the distributed amplifier 100 are operatively coupled between respective nodes or taps on an input transmission line 102 and corresponding nodes on an output transmission line 104. For example, in the illustrative distributed amplifier 100, the input of amplifying stage 120 is coupled to the input transmission line at node TAP1 and the output of amplifying stage 120 is coupled to the output transmission line at node 122. Similarly, the input of amplifying stage 130 is coupled to the input transmission line at node TAP2 and the output of amplifying stage 130 is coupled to the output transmission line at node 124, the input of amplifying stage 140 is coupled to the input transmission line at node TAP3 and the output of amplifying stage 140 is coupled to the output transmission line at node 126, and the input of amplifying stage 150 is coupled to the in put transmission line at node TAP4 and the output of amplifying stage 150 is coupled to the output transmission line at node 128.

The input transmission line 102 and output transmission line 104 are preferably formed as co-planar structures which are suitable for high-frequency operation (e.g., 75 gigahertz (GHz)). Both the input transmission line 102 and output transmission line 104 have a respective line impedance associated therewith. It is to be understood that alternative structures for implementing the transmission lines are similarly contemplated by the present invention, including, for example, spiral inductors and conductor buses, each having a certain characteristic impedance associated therewith that is selectively adjustable as desired. As apparent from FIG. 1, the transmission lines 102, 104 may include distributed series inductors coupled between corresponding inputs or corresponding outputs of the plurality of amplifying stages, with inductors L1, L2 and L3 corresponding to the output transmission line 104, and inductors L4, L5 and L6 corresponding to the input transmission line 102. Specifically, in the illustrative distributed amplifier 100, inductor L4 is shown coupled between the inputs of amplifying stages 120 and 130 at nodes TAP1 and TAP2, respectively, and inductor L1 is coupled between the outputs of amplifying stages 120 and 130 at nodes 122 and 124, respectively. Likewise, inductor L5 is coupled between the inputs of amplifying stages 130 and 140 at nodes TAP2 and TAP3, respectively, and inductor L2 is coupled between the outputs of amplifying stages 130 and 140 at nodes 124 and 126, respectively. Inductor L6 is coupled between the inputs of amplifying stages 140 and 150 at nodes TAP3 and TAP4, respectively, and inductor L3 is coupled between the outputs of amplifying stages 140 and 150 at nodes 126 and 128, respectively.

Although the series inductors L1 through L6 are depicted as purely inductive impedances, each of these impedances more accurately includes a line resistance R (not shown), connected in series with a corresponding inductor L, and a shunt capacitance C (not shown), connected between the inductor and ground, which contribute to the attenuation of the signal along the transmission lines 102, 104. The shunt line capacitance will be negligible, however, in comparison to an input capacitance and an output capacitance associated with each of the plurality of amplifying stages. The series R-L, shunt C representation closely approximates a typical transmission line model and is thus treated as such for the purposes of the present invention. By varying the series inductance in the transmission lines 102, 104, the characteristic impedance of the lines can be operatively adjusted as desired, such as, for example, to compensate for the input and/or output capacitance of the amplifying stages. The series resistance associated with the transmission lines, however, cannot be easily eliminated, and therefore the distributed amplifier 100 must be configured to compensate for the signal loss corresponding to this series resistance.

The input transmission line 102 preferably includes an input termination impedance 160 which is coupled to the input transmission line. Specifically, the input termination impedance 160 is coupled between the input to the final amplifying stage 150 at node TAP4 and a negative voltage supply, which may be ground. The value of the input termination impedance 160 is preferably selected to substantially match an impedance of the input transmission line 102, typically about fifty ohms. Similarly, the output transmission line 104 preferably includes a back termination impedance 110 which is coupled to the output transmission line. Specifically, the back termination impedance 110 is coupled between the output of the first amplifying stage at node 122 and ground. The value of the back termination impedance is preferably selected to substantially match an impedance of the output transmission line 104, again typically about fifty ohms. As understood by those skilled in the art, the input and back termination impedances may be purely reactive (inductive and/or capacitive), purely resistive, or a combination of resistive and reactive, as required to achieve a desired characteristic impedance of the respective transmission lines at the respective termination points. A load impedance represented as RLOAD is also shown in FIG. 1 coupled between the output OUT of the distributed amplifier 100 and ground.

The amplifying stages 120, 130, 140, 150 comprising the distributed amplifier 100 are preferably implemented using transconductance stages, each transconductance stage having a predetermined transconductance $g_{m1}$, $g_{m2}$, $g_{m3}$ and $g_{m4}$, respectively, associated therewith. A more detailed discussion of amplifying stages that may be suitable for use with the present invention can be found, for example, in the texts by Paul R. Gray et al., *Analysis and Design of Analog Integrated Circuits*, John Wiley & Sons (2001) and Alan B. Grebene, *Bipolar and MOS Analog Integrated Circuit Design*, John Wiley & Sons (1984), which are incorporated herein by reference. Accordingly, a detailed description of the amplifying stages will not be presented herein.

Typically, each amplifying stage in an ideal distributed amplifier is the same, and consequently the transconductance ($g_m$) associated with each of the amplifying stages in the ideal distributed amplifier will be equal. The transconductance for each amplifying stage is preferably selected so as to make the gain of each amplifying stage equal to a desired gain A for the distributed amplifier divided by the number of amplifying stages n, where n is an integer greater than or equal to one. The output signal generated by a conventional distributed amplifier would thus be approximated as:

Signal out=$g_m$ ×no. of amplifying stages×RLOAD×Signal in

Figure 2:
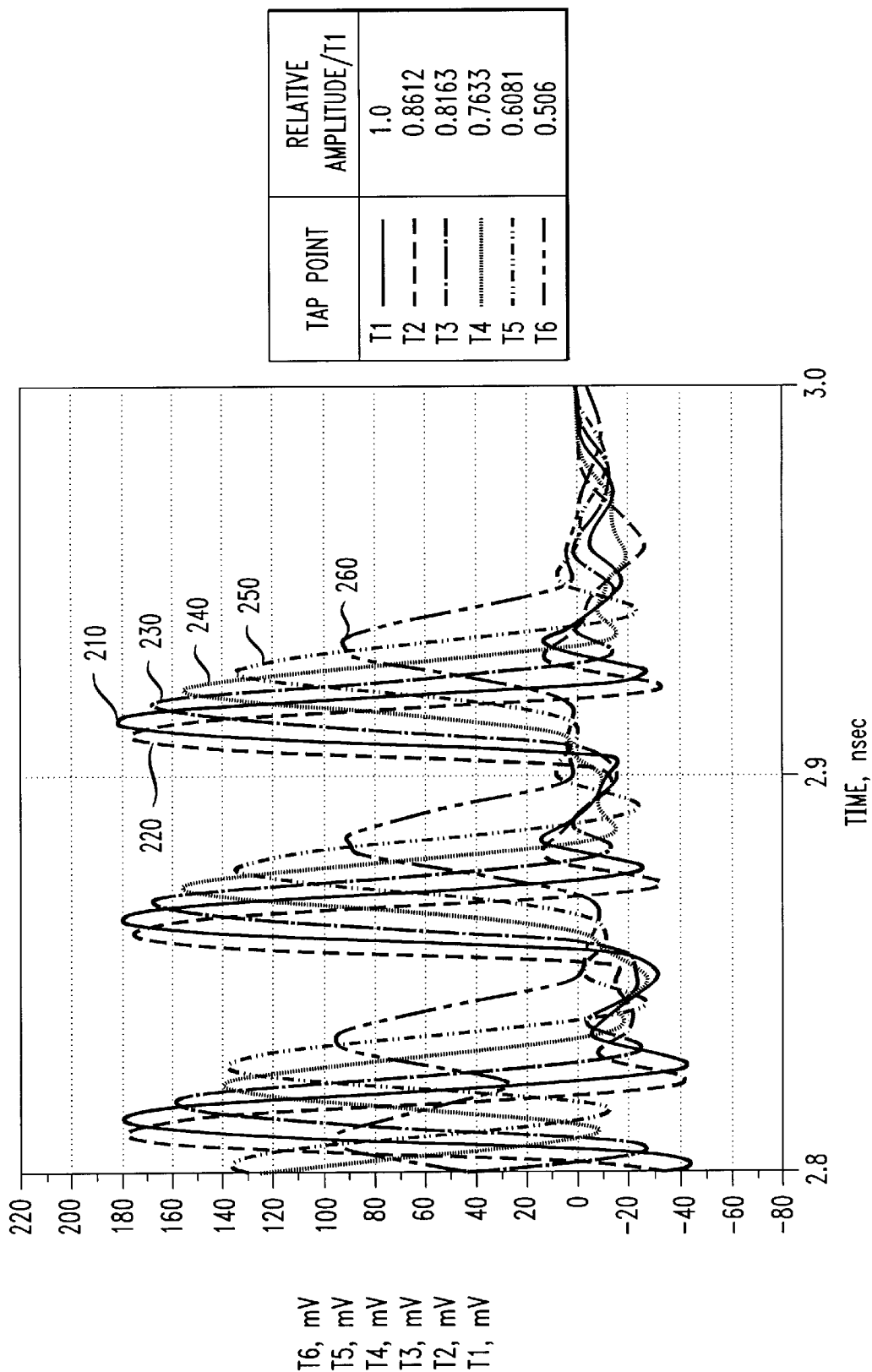
FIG. 2 is a graphical representation illustrating an input signal attenuation along a transmission line for each input tap in an exemplary six-stage distributed amplifier.

As previously stated, there is a distributed signal loss associated with the transmission lines 102, 104 in the distributed amplifier 100. This loss increases as the input signal propagates along the transmission lines from the input IN toward the output OUT of the distributed amplifier. Consequently, the actual gain of each amplifying stage will be less than the ideal gain A/n per stage, assuming no compensation is used. The input signal attenuation for an exemplary six-stage distributed amplifier is shown in FIG. 2. Waveform 210 represents the input signal at tap T1, which is the input to the first amplifying stage, waveform 220 represents the input signal at tap T2, which is the input to the second stage, waveform 230 represents the input signal at tap T3, which is the input to the third stage, waveform 240 represents the input signal at tap T4, which is the input to the fourth stage, waveform 250 represents the input signal at tap T5, which is the input to the fifth stage, and waveform 260 represents the input signal at tap T6, which is the input to the sixth stage. Relative amplitudes of the input signal at the respective taps T1 through T6 along the input transmission line are also shown in FIG. 2, with respect to tap T1. For example, at tap T2, the input signal is attenuated by 0.8612. At tap T6, the input signal is attenuated by almost half, namely, 0.506.

Referring again to FIG. 1, in accordance with the present invention, the transconductance of each of the amplifying stages 120, 130, 140, 150 in distributed amplifier 100 is substantially matched to the attenuation of the input signal on the input transmission line 102, as measured at the inputs of the respective amplifying stages, to compensate for the respective losses. In this manner, a successive amplifying stage further down the input transmission line 102, with respect to the input IN of the distributed amplifier 100, will preferably have a transconductance which is greater than the transconductance of a preceding amplifying stage, such that $g_{m1} < g_{m2} < g_{m3} < g_{m4}$. In accordance with the present invention, the distributed amplifier 100 can thus be considered as having a tapered transconductance architecture.

Although the present invention contemplates that the transconductance of each of the amplifying stages may also be adjusted to compensate for the signal attenuation on the output transmission line 104, the loss associated with the output transmission line will generally be significantly less as compared to the input transmission line 102, since the output signal loss, when referred back to the input of the particular amplifying stage, will be divided by the gain of the amplifying stage. Thus, for simplicity of explanation, the transconductances of the amplifying stages in the distributed amplifier 100 will only be adjusted to compensate for input signal attenuation.

Since the transconductances $g_{m1}$, $g_{m2}$, $g_{m3}$, $g_{m4}$ corresponding to the amplifying stages 120, 130, 140, 150, respectively, will most likely not be equal to one another, the output signal gain can be determined using a variation of the above equation. Specifically, the output signal generated by the distributed amplifier 100 at output OUT can be approximated as:

Signal out=$g_{m1}$×$g_{m2}$×$g_{m3}$×$g_{m4}$×RLOAD×Signal in

It is to be appreciated that if fewer amplifying stages are employed in the distributed amplifier 100, the transconductances of these additional stages would not appear in the above equation. Similarly, if more amplifying stages are used, the transconductances of these additional stages would be included in the above equation, as understood by those skilled in the art.

As previously stated, the transconductance of each amplifying stage is selected so as to produce a gain in the respective amplifying stage which substantially compensates for an input signal attenuation measured at the input of the amplifying stage. Preferably, the transconductance $g_{m1}$ of the first amplifying stage 120 nearest the input IN of the distributed amplifier 100 is used as a reference for calculating the transconductances $g_{m2}$, $g_{m3}$, $g_{m4}$ of the succeeding amplifying stages 130, 140, 150, respectively. The transconductance $g_{m1}$ of the first amplifying stage 120 is preferably selected so that the gain of the first amplifying stage is substantially equal to a desired gain A divided by the total number of amplifying stages, which is four in the illustrative distributed amplifier 100, although any predetermined transconductance may be chosen. Since there will be essentially no input signal loss at the input TAP1 to the first amplifying stage 120, the transconductance of the first stage does not need to be adjusted to compensate for input signal loss. Thus, since the gain of the amplifying stage is directly proportional to the transconductance, the transconductance of the first amplifying stage 120 is preferably determined as $$g_{m1} \propto \frac{A}{4}$$

The input signal attenuation at the input TAP2 of the second amplifying stage 130 can be determined as a ratio of the magnitude of the signal at node TAP2 divided by the magnitude of the signal at node TAP1. This attenuation value will be less than one. It is to be appreciated that the relative magnitudes of the input signals at each respective node along the input transmission line 102 can be determined using, for example, conventional network analysis techniques or network simulation results, as understood by those skilled in the art. A solution may be determined in a manner consistent with a typical voltage division problem. Once this attenuation value is determined, the transconductance of the second amplifying stage 130 is preferably increased accordingly to substantially compensate for the input signal attenuation. Thus, the transconductance $g_{m2}$ of the second amplifying stage 130 in the distributed amplifier 100 is preferably determined as $$g_{m2} = \frac{g_{m1}}{T2},$$

where T2 is the input signal attenuation at node TAP2. The transconductances of the remaining amplifying stages 140, 150 may be similarly determined as $$g_{m3} = \frac{g_{m1}}{T3} \quad g_{m4} = \frac{g_{m1}}{T4}$$

where T3 and T4 are the input signal attenuations at nodes TAP3 and TAP4, respectively.

Assuming metal-oxide semiconductor (MOS) devices are employed in the distributed amplifier 100, the transconductance of a particular amplifying stage can be selectively varied, for example, by changing a width W of one or more input transistors comprising the amplifying stage while leaving a length L of the input transistors constant, thereby increasing a W/L ratio of the particular transistor. Thus, by increasing the width of the input transistors in a given amplifying stage, the transconductance of that stage will increase proportionally. The transconductance of an amplifying stage may also be changed using other suitable techniques, for example, by varying a quiescent current in the input transistors comprising the amplifying stage. As previously stated, the techniques of the present invention are not limited to a MOS fabrication process. Rather, the present invention may be employed with other semiconductor processes including, but not limited to, bipolar and MESFET process technologies. In a bipolar process, for example, the transconductance of the input transistors is generally approximated as $$\frac{I_C}{V_T},$$

where $I_C$ is the collector current in the transistors and $V_T$ is the thermal voltage of the transistors, which is typically about 26 millivolts (mV) at 300 degrees Kelvin. Therefore, the bipolar transconductance may be selectively varied, for example, by changing a collector current $I_C$ in the transistors or an emitter area of the transistors, as understood by those skilled in the art.

In accordance with the techniques of the present invention, the transconductance of each of the amplifying stages is preferably ratioed in accordance with the relative attenuations of the input signal at the inputs to the respective amplifying stages. As previously stated, since the relative input signal attenuation increases as the signal propagates along the input transmission line 102 from the input IN to the output OUT of the distributed amplifier 100, the transconductance of each successive amplifying stage down the input transmission line is operatively increased to compensate for the respective signal loss, such that the effective gain at the output of each amplifying stage substantially matches the ideal gain $$\frac{A}{n}$$

if transmission line losses were not present, where A is the desired gain of the distributed amplifier and n is the number of amplifying stages in the distributed amplifier.

It is to be appreciated that every amplifying stage in the distributed amplifier 100 need not be configured in the manner described above. Instead, a subset comprising one or more amplifying stages in the distributed amplifier may be configured in the manner thus described and still achieve at least some of the objectives and advantages of the present invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope or spirit of the invention.

What is claimed is:

1. A distributed amplifier, comprising:
   an input transmission line, the input transmission line forming an input of the distributed amplifier and having a characteristic impedance associated therewith;
   an output transmission line, the output transmission line forming an output of the distributed amplifier and having a characteristic impedance associated therewith; and
   a plurality of amplifying stages arranged in a sequence and in parallel with one another, each of at least a subset of the amplifying stages including an input and an output, the input of each amplifying stage in the subset being operatively coupled to the input transmission line and the output of each amplifying stage in the subset being operatively coupled to the output transmission line, each amplifying stage in the subset having a transconductance associated therewith which is operatively configured so as to produce a gain in the amplifying stage that substantially compensates for an input signal attenuation at the respective input of the amplifying stage, at least one of the plurality of amplifying stages having a transconductance associated therewith which is greater than a transconductance associated with a preceding one of the plurality of amplifying stages in the sequence.

2. The distributed amplifier of claim 1, wherein every amplifying stage in the distributed amplifier has a transconductance associated therewith which is operatively configured so as to produce a gain in the amplifying stage that substantially compensates for an input signal attenuation at the respective input of the amplifying stage.

3. The distributed amplifier of claim 1, further comprising a plurality of inductors, each of the inductors being operatively coupled in series with the input transmission line between the inputs of two adjacent amplifying stages and coupled in series with the output transmission line between the outputs of two adjacent amplifying stages.

4. The distributed amplifier of claim 3, wherein at least one of the plurality of inductors is operatively configured to have an inductance which is substantially matched to one of (i) an input capacitance of a corresponding amplifying stage; and (ii) an output capacitance of a corresponding amplifying stage.

5. The distributed amplifier of claim 1, wherein the transconductance of each amplifying stage in the subset is configured by selectively adjusting at least one of (i) a width-to-length (W/L) ratio of at least one transistor in the respective amplifying stage; (ii) an emitter area of at least one transistor in the respective amplifying stage; and (iii) a current in at least one transistor in the respective amplifying stage.

6. The distributed amplifier of claim 1, wherein at least one amplifying stage of the plurality of amplifying stages is operatively configured so that a gain of the at least one amplifying stage substantially compensates for an output signal attenuation on the output transmission line at the output of the at least one amplifying stage.

7. The distributed amplifier of claim 1, wherein at least one of the input transmission line and the output transmission line comprises a co-planar structure.

8. The distributed amplifier of claim 1, wherein at least one of the input transmission line and the output transmission line comprises at least one spiral inductor.

9. The distributed amplifier of claim 1, wherein at least one of the plurality of amplifying stages comprise a transconductance stage.

10. A method of forming a distributed amplifier including a plurality of amplifying stages arranged in a sequence and in parallel with one another, each of at least a subset of the amplifying stages having a transconductance associated therewith and including an input and an output, the input of each amplifying stage in the subset being operatively coupled to an input transmission line, the output of each amplifying stage in the subset being operatively coupled to an output transmission line, the method comprising the steps of:

determining an input signal attenuation at the respective inputs of each amplifying stage in the subset; and selecting the transconductances of the amplifying stages in the subset such that a gain of each amplifying stage in the subset substantially compensates for an input signal attenuation on the input transmission line at the respective input of the amplifying stage, at least one of the plurality of amplifying stages having a transconductance associated therewith which is greater than a transconductance associated with a preceding one of the plurality of amplifying stages in the sequence.

11. The method of claim 10, wherein the step of determining the input signal attenuation at the respective inputs of each amplifying stage in the subset is performed using a network analysis technique.

12. The method of claim 10, wherein the step of selecting the transconductances of each of the amplifying stages in the subset comprises at least one of (i) varying a width-to-length ratio (W/L) of at least one transistor in the respective amplifying stage; (ii) varying an emitter area of at least one transistor in the respective amplifying stage; and (iii) varying a current in at least one transistor in the respective amplifying stage.

13. The method of claim 10, further comprising the step of:

selecting the transconductance of at least one amplifying stage of the plurality of amplifying stages such that a gain of the at least one amplifying stage substantially compensates for an output signal attenuation on the output transmission line at the respective output of the at least one amplifying stage.

14. The method of claim 10, further comprising the step of:

configuring the input transmission line so that a characteristic impedance of the input transmission line substantially compensates for an input capacitance associated with at least one of the plurality of amplifying stages.

15. The method of claim 10, further comprising the step of:

configuring the output transmission line so that a characteristic impedance of the output transmission line substantially compensates for an output capacitance associated with each of the plurality of amplifying stages.

16. The method of claim 10, further comprising the steps of:

determining an input signal attenuation at the respective inputs of every amplifying stage in the distributed amplifier; and selecting the transconductances of every amplifying stage such that a gain of the respective amplifying stage substantially compensates for an input signal attenuation on the input transmission line at the corresponding input of the amplifying stage.

17. An integrated circuit including at least one distributed amplifier, the at least one distributed amplifier comprising:

an input transmission line, the input transmission line forming an input of the distributed amplifier and having a characteristic impedance associated therewith;

an output transmission line, the output transmission line forming an output of the distributed amplifier and having a characteristic impedance associated therewith; and a plurality of amplifying stages arranged in a sequence and in parallel with one another, each of the amplifying stages including an input and an output, the input of each amplifying stage being operatively coupled to the input transmission line and the output of each amplifying stage being operatively coupled to the output transmission line, each amplifying stage in at least a subset of the amplifying stages having a transconductance associated therewith which is operatively configured so as to produce a gain in the amplifying stage that substantially compensates for an input signal attenuation at the respective input of the amplifying stage, at least one of the plurality of amplifying stages having a transconductance associated therewith which is greater than a transconductance associated with a preceding one of the plurality of amplifying stages in the sequence.

18. The integrated circuit of claim 17, wherein every amplifying stage in the at least one distributed amplifier has a transconductance associated therewith which is operatively configured so as to produce a gain in the amplifying stage that substantially compensates for an input signal attenuation at the respective input of the amplifying stage.

19. The integrated circuit of claim 17, wherein the at least one distributed amplifier further comprises:

a plurality of inductors, each of the inductors being operatively coupled in series with the input transmission line between the inputs of two adjacent amplifying stages and coupled in series with the output transmission line between the outputs of two adjacent amplifying stages.

20. The integrated circuit of claim 19, wherein each of the plurality of inductors in the at least one distributed amplifier is operatively configured to have an inductance which is substantially matched to one of (i) an input capacitance of a corresponding amplifying stage; and (ii) an output capacitance of a corresponding amplifying stage.

21. The integrated circuit of claim 17, wherein the transconductance of each amplifying stage in the subset of amplifying stages in the at least one distributed amplifier is adjusted by selectively varying at least one of (i) a width-to-length (W/L) ratio of at least one transistor in the respective amplifying stage; (ii) an emitter area of at least one transistor in the respective amplifying stage; and (iii) a current in at least one transistor in the respective amplifying stage.

22. The integrated circuit of claim 17, wherein at least one amplifying stage of the plurality of amplifying stages in the at least one distributed amplifier is operatively configured so that a gain of the at least one amplifying stage substantially compensates for an output signal attenuation on the output transmission line at the output of the at least one amplifying stage.

23. The integrated circuit of claim 17, wherein at least one of the input transmission line and the output transmission line in the at least one distributed amplifier comprises a co-planar structure.

24. A distributed amplifier, comprising:

a plurality of amplifying stages arranged in a sequence and in parallel with one another, each of the amplifying stages including an input and an output, the inputs of the plurality of amplifying stages being operatively coupled together and forming an input of the distributed amplifier, the outputs of the plurality of amplifying stages being operatively coupled together and forming an output of the distributed amplifier, each of at least a subset of the amplifying stages having a transconductance associated therewith which is substantially matched to an input signal attenuation of the distributed amplifier at the respective inputs of the amplifying stages in the subset, at least one of the plurality of amplifying stages having a transconductance associated therewith which is greater than a transconductance associated with a preceding one of the plurality of amplifying stages in the sequence.

* * * * *